Jan. 25, 1966 D. J. SHOMBERT 3,231,796

PNPN SEMICONDUCTOR SWITCH WITH PREDETERMINED FORWARD BREAKOVER AND REVERSE BREAKDOWN VOLTAGES

Filed Aug. 1, 1963

INVENTOR
DONALD J. SHOMBERT
BY [signature]
ATTORNEY

United States Patent Office 3,231,796

Patented Jan. 25, 1966

3,231,796

PNPN SEMICONDUCTOR SWITCH WITH PREDETERMINED FORWARD BREAKOVER AND REVERSE BREAKDOWN VOLTAGES

Donald J. Shombert, Berkeley Heights, N.J., assignor to Merck & Co., Inc., Rahway, N.J., a corporation of New Jersey Filed Aug. 1, 1963, Ser. No. 303,464
9 Claims. (Cl. 317—235)

This invention relates to semiconductor devices, and more particularly to P-N-P-N semiconductor switches which have a predetermined and different forward breakover and reverse breakdown voltages.

This application is a continuation-in-part of Serial No. 77,266, abandoned, filed December 20, 1960.

The P-N-P-N semiconductor switch has long been known in the prior art and is disclosed in Patent No. 2,855,524 issued October 7, 1958, to W. Shockley. Many of the uses for such a device have been discussed in the literature. As is disclosed in Patent No. 2,855,524, the point at which such a switch will exhibit a low impedance in the forward direction may be adjusted to desired values in accordance with techniques known to those skilled in the semiconductor art. By exercising these prior art techniques in adjusting the point at which such a device exhibits low impedance in the forward direction, that is the forward breakover voltage, the point at which such a device exhibits a low impedance in the reverse direction, that is breaks down in the reverse biased direction, is automatically determined and in accordance with the prior art cannot be adjusted or controlled.

If the forward breakover voltage of a P-N-P-N switch is established by diffusing a conductivity determining type active impurity into a semiconductor crystal to provide the desired electrical characteristics for the center junction of the device, the electrical characteristics of the two end junctions of the device are inherently determined by the diffusion characteristics of the active impurity material into the semiconductor crystal and by the electrical characteristics of the semiconductor crystal as determined during its formation. These electrical and diffusion characteristics cannot normally be changed in accordance with the prior art and they thereby automatically determine the reverse breakdown voltage of the device.

Similar considerations must be taken when the prior art technique of alloying is used to form one or more of the junctions in a P-N-P-N switch. This is necessary since the electrical characteristics of a junction so formed are determined by the segregation constant of the active impurity material in the semiconductor material at the temperature, impurity material concentration and time chosen. Once so determined they cannot normally be altered and, therefore, the reverse breakdown voltage is thus determined.

Such prior art techniques by thus providing no control over the reverse breakdown voltage inherently limits the uses to which such a switch may be put.

Accordingly, it is an object of the present invention to provide a P-N-P-N semiconductor switch in which the forward breakover voltage and the reverse breakdown voltage are individually and independently predetermined and controlled.

Other objects and advantages of semiconductor device in accordance with the present invention will become apparent from a consideration of the following description taken in conjunction with the accompanying drawing which is presented by way of example only and in which.

In accordance with one aspect of the present invention, there is provided a semiconductor body constructed of essentially single crystalline semiconductor material. The body includes four zones of semiconductor material, contiguous zones being of opposite conductivity type thereby providing a center and two end junctions. The semiconductor material in the two intermediate zones is such that the center junction when biased in the reverse direction, has a first predetermined breakdown voltage and the two end junctions when biased in the reverse direction have a second predetermined breakdown voltage.

In accordance with another aspect of the present invention, there is provided a P-N-P-N semiconductor switch having four zones of substantially single crystalline semiconductor material in which the contiguous zones are of alternative conductivity type thereby defining a center and two end junctions. Each of the intermediate zones of semiconductor material immediately adjacent the center junction has a resistivity which determines the breakdown voltage of the center junction when it is reverse biased and thus the forward breakover voltage of the P-N-P-N switch. The remainder of the material in each of the intermediate zones of the semiconductor body has a different resistivity which determines the breakdown voltage of the P-N-P-N switch when it is reversed biased.

Figure 1:
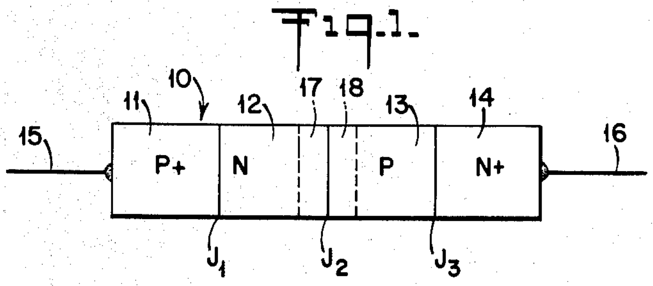
FIG. 1 is a schematic illustration of a P-N-P-N switch in accordane with the present invention.

Referring now more particularly to FIG. 1, there is illustrated one embodiment of a P-N-P-N semiconductor switch in accordance with the present invention. As is therein illustrated, a semiconductor body 10 constructed essentially of single crystalline semiconductor material includes four separate zones 11 through 14 contiguous zones of which are of alternate conductivity types. For example, zone 11 is P-type while zone 12 is N-type material. Although a semiconductor P-N-P-N switch in accordance with the present invention may be constructed of any semiconductor material which is desired, for example, germanium, silicon, germanium-silicon alloy, Group III–V intermetallic compounds such as gallium-arsenide, indium-arsenide, indium-antimonide, and the like, the following description will be given with particular reference to silicon for purposes of clarity of description and example only.

The contiguous zones of opposite conductivity type semiconductor material 11 through 14 cooperate to provide a junction between the contiguous zones, for example, as illustrated at J1, J2 and J3. J2 is the center junction formed by the contiguous intermediate zones of opposite conductivity type semiconductor material 12 and 13 while J1 and J3 are the two end junctions. Electrical connection is made to the P-type zone 11 to the N-type zone 14 by affixing leads 15 and 16, respectively, thereto in accordance with well known techniques in the art. The terminal zones 11 and 14 of the semiconductor body 10 are constructed of very low resistivity silicon material to provide a low resistance for the semiconductor device when it is in either of its low impedance states. Low resistivity material has the additional advantages of providing emitters having high injection efficiency for each of the transistors and in that it permits electrical connection to be easily made to the finished device.

As is well known in the prior art, the forward breakover voltage for a P-N-P-N switch, that is, that point at which the P-N-P-N switch when biased in the forward direction passes from its high impedance state to its low impedance state is controlled by the inherent alpha of each of the intermediate zones of the semiconductor device. The inherent alpha is defined as the ratio of the current change across the collecting junction of the zone to the current change across the emitting junction of the zone if the potential across the collecting junction is held constant. If the sum of the alphas for each of the intermediate zones is equal to or greater than unity the semiconductive switch exhibits a low impedance in the forward direction. If this sum is less than unity, the switch exhibits a high impedance in the forward direction.

The reverse breakdown voltage of a P-N-P-N switch in accordance with the well known techniques in the art is determined by the bulk breakdown voltage of each of the intermediate zones. The total breakdown voltage for the P-N-P-N switch in the reverse biased direction is determined by the sum of each of the bulk breakdown voltage for each individual zone.

Typically in the prior art the bulk breakdown properties of the intermediate zones was determined solely by the construction of the intermediate zones to obtain the desired point at which the sum of the inherent alphas exceeded unity. In accordance with the present invention, the inherent alphas of each of the intermediate zones is controlled by controlling the resistivity of the semiconductor material in each of the zones immediately adjacent the center junction J2. For example, assuming that a P-N-P-N switch having a low breakover voltage and a high reverse breakdown voltage is desired, the inherent alpha which determines the forward breakover voltage is established by controlling the resistivity of the material in the regions 17 and 18 immediately adjacent the center junction J2 in the intermediate zones 12 and 13, respectively (FIG. 1). By providing semiconductor material having a relatively low resistivity for the material in the regions 17 and 18 the inherent alpha of each of the intermediate zones 12 and 13 is such that the sum thereof equals unity when a relatively low forward bias is applied to the device; that is, a bias which is positive at lead 15 and negative at lead 16.

The remainder of each of the zones 12 and 13 is provided as relatively high resistivity material to thereby control the reverse breakdown voltage of the device 10; that is, the breakdown voltage when the potential at lead 15 is negative and the potential at lead 16 is positive.

Figure 2:
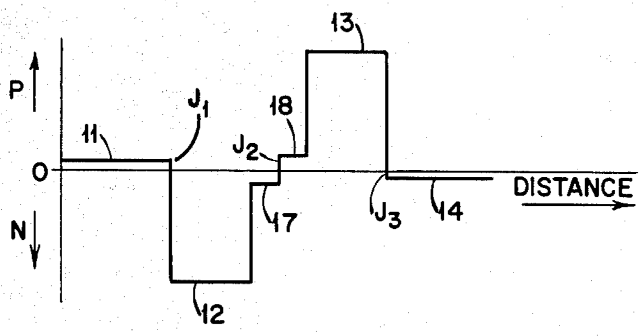
FIG. 2 is a graph illustrating the resistivity profile of the device of FIG. 1.

This can better be seen by reference to FIG. 2 which is a resistivity profile of a semiconductor P-N-P-N switch as illustrated in FIG. 1. The resistivity is plotted on the ordinate while distance along the device is plotted on the abscissa. The resistivity of the P-type regions is illustrated as increasing in the upward direction while the resistivity of the N-type regions is shown increasing in the downward direction. As can be seen, the resistivity in the P+ type zone 11 is quite low as is the resistivity of the N+ type zone 14. The intermediate zones 12 and 13 each have a region of high resistivity and a region of low resistivity. The low resistivity regions 17 and 18 are illustrated as being immediately adjacent and on each side of the center junction J2.

A device of the type as illustrated in FIGS. 1 and 2 and above described, may be constructed in accordance with the method disclosed and claimed in U.S. patent application Serial No. 19,054, abandoned, filed March 31, 1960, by J. Allegretti et al. As is therein disclosed, an essentially single crystal silicon semiconductor device may be constructed by depositing atoms of silicon semiconductor material along with atoms of a desired active impurity from a decomposable source thereof upon a heated single crystal silicon starting member mounted within a closed reaction chamber. After the material has been deposited to a desired depth, the reaction chamber is flushed with a gas which removes any residual active impurity atoms within the reaction chamber other than those present within the deposited semiconductor material. Additional semiconductor source material along with atoms of active impurity of the opposite type are then inserted into a closed reaction chamber and again caused to decompose and deposit upon the heated semiconductor crystal mounted within the reaction chamber. The resistivity of the silicon semiconductor material which is deposited in this manner is readily controlled by merely controlling the concentration of the conductivity determining type active impurity atoms in the decomposable source material which is injected into the reaction chamber.

Utilizing the technique disclosed in the Allegretti et al. patent application, it can be seen therefore that a device as illustrated in FIG. 1 may be easily constructed. This can be accomplished by first depositing a P+ type layer of semiconductor material upon a single crystal semiconductor starting element. The P+ layer is deposited to any depth which is desired since the dimensions thereof are not in any way critical. After the desired depth of the P+ silicon material has been deposited, the reaction chamber is flushed with a flushing gas, such as silicon tetrachloride, for a period of time sufficient to remove any unwanted P-type active impurity atoms which may be present within the reaction chamber. Additional source material along with atoms of an N-type active impurity material are then inserted into a reaction chamber. The amount of active impurity source material is at this point controlled in accordance with the predetermined bulk breakdown voltage of the zone 12 which is desired. N-type semiconductor material of the desired resistivity is then deposited to a thickness which is sufficient to avoid electrical punch-through.

After the material has been deposited to the sufficient thickness, the concentration of the N-type active impurity material which is injected into the reaction chamber is increased to a point sufficient to give the desired lower resistivity for the region 17 of the N-type zone 12. Thereafter, the semiconductor source material having the predetermined concentration of N-type active impurity material therein is allowed to decompose thereby depositing N-type silicon of the desired resistivity to a predetermined depth.

Thereafter, P-type silicon is deposited in a similar manner and with a concentration of P-type active impurity material therein sufficient to provide the low resistivity type region 18 adjacent the low resistivity P-type region 17 thereby providing a junction J2 therebetween. After the desired depth of low resistivity P-type material 18 is deposited, the concentration of P-type active impurity material in the decomposable source material is lowered to provide the higher resistivity P-type region which makes up the remainder of the P-type zone 13. The flushing step above outlined is followed when the conductivity type determining activity impurity material is changed from N-type to P-type in order to provide precise location of the junction 12. After the desired depth of P-type material, which is controlled by the thickness needed to avoid electrical punch through, is deposited, the N+ type zone 14 is deposited. This is accomplished by injecting a heavy concentration of N-type active impurity material into the decomposable silicon source material. This may be accomplished without following the flushing step since the semiconductor material which is deposited changes from a high resistivity P-type to a very low resistivity N+ type for the zone 14. After the desired thickness of the zone 14 has been deposited, the semiconductor body thus formed may be removed from the reaction chamber and a device may be sliced from the semiconductor body in accordance with well known techniques in the art. Electrical leads 15 and 16 may then be applied and the entire device encapsulated in accordance with well known techniques to provide a finished P-N-P-N semiconductor switch.

Figure 3:
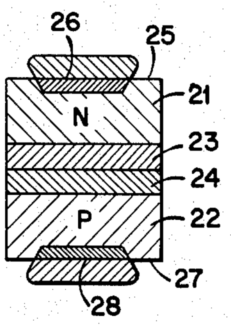
FIG. 3 is an illustration of an alternative embodiment of a P-N-P-N switch in accordance with the present invention.

An alternative embodiment of a P-N-P-N semiconductor switch in accordance with the present invention is illustrated in FIG. 3. As is therein shown, there are two intermediate zones of semiconductor material 21 and 22. Each of these zones has a region of low resistivity 23 and 24, respectively, while the remainder of the zones are of high resistivity semiconductor material. The terminal zones may be constructed by alloying into the terminal surfaces of the intermediate zones 21 and 22. For example, an aluminum pellet or foil may be alloyed into the terminal surface 25 of the N-type zone 21 to provide a P+ regrown silicon region 26 therein. A lead-antimony alloy pellet may be alloyed into the surface 27 of the P-type zone 22 to provide an N+ type regrown region 28 in the P-type zone 22. The intermediate zones 21 and 22 having the controlled resistivity materials therein may be constructed in accordance with the vapor deposition technique above outlined and as disclosed in the Allegretti et al. application. It should also be understood that the P+ and N+ type terminal zones for the P-N-P-N switch may be constructed by diffusing active impurity materials into the terminal surfaces of the intermediate zones 21 and 22 as illustrated in FIG. 3. The only criteria for formation of the terminal zones is that they be relatively low resistivity as compared to the terminal regions of the intermediate zones.

A P-N-P-N switch in accordance with the present invention may be utilized in many applications heretofore impossible for prior art P-N-P-N switches. For example, a P-N-P-N switch in accordance with the present invention may be utilized in an application where an A.-C. signal is applied across the terminals of the semiconductor switch as illustrated in FIGS. 1 and 3 wherein it is desired that the switch exhibit low impedance in the forward direction but exceedingly high impedance over a wide voltage range in the reverse direction. The switch then passes the A.C. signal during the period of time that it causes the P-N-P-N device to be forward biased and to thereby exhibit low impedance, but exhibits exceedingly high impedance throughout the entire perod of time that the A.-C. signal reverse biases the P-N-P-N switch.

It should also be expressly understood that a P-N-P-N switch in accordance with the present invention may be constructed utilizing the techniques above outlined in such a manner that the forward breakover voltage is high while the reverse breakdown voltage of the device is low. Such a device would be constructed wherein the regions 17 and 18 as shown in FIG. 1 would be constructed of relatively high resistivity material while the bulk of the zones 12 and 13 would be constructed of relatively low resistivity material. Various other combinations of resistivities for the various regions and zones of the intermediate portions of the semiconductor body 10 will become readily apparent to those skilled in the art.

Figure 4:
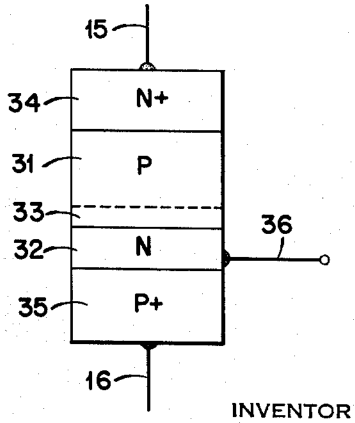
FIG. 4 shows another alternative embodiment of a P-N-P-N switch in accordance with this invention used as a controlled rectifier.

An additional electrical connection may be provided to one of the intermediate zones of the P-N-P-N switch in accordance with the present invention to provide a means of controlling the forward breakover point irrespective of the applied forward voltage. Such a device is commonly referred to as a controlled rectifier and is shown schematically in FIG. 4. As illustrated, there are two intermediate zones of semiconductor material 31 and 32 and one region 33. Zone 31 is of a predetermined high resistivity while zone 32 and region 33 may be constructed so that it has a predetermined low resistivity. Electrical connections are made to P+ type zone 35 and N+ type zone 34 which are of quite low resistivity. Control electrode 36, connected to zone 32, is provided to control the forward breakover voltage. In operation, the forward breakover voltage is determined by the resistivities of zone 32 and region 33 while the reverse breakdown voltage is determined by the resistivities of zone 31 and 32. The advantages of this structure will be readily apparent to one skilled in the art in that by predetermining the resistivities of the various zones and regions, the forward breakover voltage and the reverse breakdown voltage may be predetermined with relation to each other. Zone 32 may be made quite thin with a predetermined homogeneous resistivity in order to enable more sensitive control of the device by means of control eelctrode 36.

In general the forward breakover voltages and reverse breakdown voltages range between 1 and 5,000 volts. In order to provide such structures, the regions 12 and 13, for example, in FIG. 1, have resistivities which range from 0.1 to 500 ohm-cm. and thicknesses between about 0.1 mil to 10 mils. Similarly, layers 17 and 18 in FIG. 1 have resistivities which range from 0.1 to 500 ohm-cm. and thicknesses between about 0.1 mil to 10 mils.

The following data is presented to illustrate the fabrication of a typical device in accordance with the present invention.

| Layer | Resistivity (ohm-cm.) | Thickness (mils) |
|---|---|---|
| 11 | $5\times10^{-3}$ | 0.2 |
| 12 | 20 | 2 |
| 13 | 80 | 2 |
| 14 | 5 | 0.2 |
| 17 | 1 | 0.3 |
| 18 | $5\times10^{-3}$ | 0.3 |

The device thus operates in the forward direction with the center junction reversed biased at about 100 volts. In the reverse direction with the outer two junctions reverse biased, it has a reverse breakdown voltage of 1,000 volts.

In accordance with the vapor deposition method described above, the various regions and layers in the device having these resistivities and thicknesses are easily fabricated. For example, N regions are made by depositing donor atoms from the vapor phase; as for example, $PCl_3$. In order to provide a 10 ohm-cm. layer for example, $5\times10^{14}$ atoms of P per cc. of silicon is deposited. This is equivalent to $2\times10^{-6}$ cc. of $PCl_3$ per liter of $SiHCl_3$. For the P regions $BCl_3$ may be used. Approximately 15 times as much $BCl_3$ is used as $PCl_3$ for the same amount of doping atoms desired in the layer.

Several devices may be produced in accordance with the present invention wherein the forward breakover voltage and the reverse breakdown voltage of the P-N-P-N transistor are individually and independently controlled. The reverse breakdown voltage can be either lower or higher than the forward breakover voltage. Preferably the forward breakover voltage is made lower than the reverse breakdown voltage, suitably one-half of the latter, or less.

There has thus been disclosed a P-N-P-N-semiconductor switch in which the forward breakover voltage is individually controlled during the construction of the device, and in which the reverse breakdown voltage is individually controlled but separately from the forward breakover voltage during the construction of the device.

What is claimed is:

1. A semiconductor P-N-P-N switch, comprising four zones of essentially single crystalline semiconductor material, the end zones being of relatively low resistivity, contiguous zones being of opposite conductivity types thereby forming a center junction and two end junctions, the semiconductor material immediately adjacent said center junction having a first predetermined resistivity, the semiconductor material in the remainder of the intermediate zones having a second predetermined resistivity, said first predetermined resistivity being lower than said second predetermined resistivity, said first predetermined resistivity being determined by the forward breakover voltage of said switch, said second resistivity being determined by the reverse breakdown voltage of said switch thereby providing a semiconductor device in which the forward breakover voltage and reverse breakdown voltage are individually and independently predetermined and controlled apart from each other.

2. A P-N-P-N semiconductor switch having a first predetermined voltage at which said switch exhibits a low impedance when biased in the forward direction and a second predetermined voltage at which said switch exhibits a low impedance when biased in the reverse direction, said P-N-P-N switch comprising four contiguous zones of substantially single crystalline semiconductor material, the end zones being of relatively low resistivity, alternate zones being of opposite conductivity type to thereby form a center and two end junctions, the two intermediate zones of said material each having a first and a second region, said first region of each of said zones being disposed immediately adjacent said center junction, said first regions having first predetermined resistivities for causing said switch to exhibit a low impedance at said first predetermined voltage, and said second regions having predetermined resistivities such that the sum of the bulk reverse breakdown voltage of each of said intermediate zones is substantially equal to said second predetermined voltage, said first predetermined resistivities being lower than said second predetermined resistivities.

3. A P-N-P-N semiconductor switch having a first predetermined voltage at which said switch exhibits a low impedance when biased in the forward direction and a second predetermined voltage at which said switch exhibits a low impedance when biased in the reverse direction, said P-N-P-N switch comprising four contiguous zones of substantially single crystalline semiconductor material, the end zones being of relatively low resistivity, alternate zones being of opposite conductivity type to thereby form a center and two end junctions, the two intermediate zones of said material each having a first and a second region, said first region of each of said zones being disposed immediately adjacent said center junction, said first regions having first predetermined resistivities for causing said switch to exhibit a low impedance at said first predetermined voltage, and said second regions having second predetermined resistivtes for causng said switch to exhibit a low impedance at said second predetermined voltage, said first predetermined resistivities being lower than said second predetermined resistivities.

4. A P-N-P-N semiconductor switch, comprising four zones of essentially single crystalline silicon semiconductor material, the end zones being of relatively low resistivity, contiguous zones being of opposite conductivity type thereby providing a center and two end P-N junctions, the intermediate zones of said switch each having first and second regions therein, each of said first regions being immediately adjacent said center junction and having a low resistivity whereby said switch exhibits a low impedance when biased in the forward direction at a first predetermined voltage, and each of said second regions being the remainder of said intermediate zones and having a high resistivity as compared to said first regions whereby said switch exhibits a low impedance when biased in the reverse direction at a second predetermined voltage, said second voltage being greater than said first voltage.

5. A P-N-P-N semconductor device, comprising four zones of essentially single crystalline semiconductor material, the end zones being of relatively low resistivity, contiguous zones being of opposite conductivity type thereby provding a center and two end P-N junctions, one of the intermediate zones of said device having a region therein immediately adjacent said center junction having a first predetermined resistivity, and the semiconductor material in the remainder of said zone having a second predetermined resistivity, said first predetermined resistivity being lower than said second predetermined resistivity, the semconductor material in said other intermediate zone having a third predetermined resistivity, the forward breakover voltage of said device being determined by said first and third predetermined resistivities and the reverse breakdown voltage being determined by said second and third predetermined resistivities thereby providing a semiconductor device in which the forward and reverse voltages are individually and independently predetermined and controlled apart from each other.

6. A semiconductor device, comprising first, second, third and fourth contiguous zones of substantially single crystalline semiconductor material, said first and third zones being of one conductivity type and said second and fourth zones being of an opposite conductivity type whereby a P-N junction is formed between each zone and its next successive zone, said first and fourth zones having a resistivity relatively lower than said second and third zones, the forward breakover voltage being determined by the center P-N junction being no more than one-half of the reverse breakdown voltage which is determined by the end P-N junctons, and said second and third zones each including a region immediately adjacent the center P-N junction having a resistivity lower than the resistivity of the remainder of said second and third zones.

7. A semiconductor device, comprising first, second, third and fourth contiguous zones of substantially single crystalline semiconductor material, said first and third zones being of one conductivity type and said second and fourth zones being of an opposite conductivity type whereby a P-N junction is formed between each zone and its next successive zone, said first and fourth zones having a resistivity relatively lower than said second and third zones, and at least one of said second and third zones including a region immediately adjacent the center P-N junction having a resistivity relatively lower than the remainder of said at least one zone.

8. A semiconductor device, comprising first, second, third, and fourth contiguous zones of substantially single crystalline semiconductor material, said first and third zones being of one conductivity type and said second and fourth zones being of an opposite conductivity type whereby a P-N junction is formed between each zone and its next successive zone, said first and fourth zones having a resistivity relatively lower than said second and third zones, and at least one of said second and third zones including a region immediately adjacent the center P-N junction having a resistivity relatively lower than the remainder of said at least one zone and between 0.1 and 500 ohm-cm.

9. A semiconductor device, comprising first, second, third, and fourth contiguous zones of substantially single crystalline semiconductor material, said first and third zones being of one conductivity type and said second and fourth zones being of an opposite conductivity type whereby a P-N junction is formed between each zone and its next successive zone, said first and fourth zones having a resistivity relatively lower than said second and third zones, and said second and third zones each including a region immediately adjacent the center junction having a resistivity lower than the resistivity of said second and third zones, said resistivities of said regions and zones being between 0.1 and 500 ohm-cm. and said thicknesses between 0.1 mil and 10 mils.

References Cited by the Examiner

UNITED STATES PATENTS

| | | | |
|---|---|---|---|
| 2,997,604 | 8/1961 | Shockley | 307—88.5 |
| 3,152,928 | 10/1964 | Hubner | 317—235 |

JOHN W. HUCKERT, *Primary Examiner.*

JAMES D. KALLAM, *Examiner.*

L. ZALMAN, *Assistant Examiner.*